United States Patent [19]

Turner

[11] Patent Number: 5,321,262
[45] Date of Patent: Jun. 14, 1994

[54] ELECTRON IMAGING BAND PASS ANALYSER FOR A PHOTOELECTRON SPECTROMICROSCOPE

[75] Inventor: David W. Turner, Headington, Great Britain

[73] Assignee: Kratos Analytical Limited, Manchester, United Kingdom

[21] Appl. No.: 954,950

[22] Filed: Sep. 30, 1992

Related U.S. Application Data

[63] Continuation of Ser. No. 634,878, Mar. 11, 1991, Pat. No. 5,166,519.

[51] Int. Cl.$^5$ .............................................. H01J 37/05
[52] U.S. Cl. ........................................ 250/305; 250/306; 250/281; 250/294; 250/296 R
[58] Field of Search ............... 250/281, 282, 305, 306, 250/294, 296, 297, 396 R, 397, 311

[56] References Cited

U.S. PATENT DOCUMENTS

| | | | |
|---|---|---|---|
| 3,579,270 | 5/1971 | Daly et al. | 250/41.9 |
| 3,774,028 | 11/1973 | Daly | 250/41.9 |
| 3,786,359 | 1/1974 | King | 328/233 |
| 4,292,519 | 9/1981 | Feuerbaum | 250/310 |
| 4,417,175 | 11/1983 | Curren et al. | 315/5.38 |
| 4,810,883 | 3/1989 | Turner | 250/305 |
| 5,166,519 | 11/1992 | Turner | 250/305 |

*Primary Examiner*—Jack I. Berman
*Assistant Examiner*—James Beyer
*Attorney, Agent, or Firm*—Stanley J. Price, Jr.

[57] ABSTRACT

A low pass filter for use in an image band pass filter of a photoelectron spectromicroscope incorporating a virtual potential surface for reflecting electrons below a particular energy and a special charged particle trap or super dump for unwanted electrons. The filter construction with the super dump reduces the proportion of elastically and inelastically scattered high energy electron escaping the filter.

9 Claims, 8 Drawing Sheets

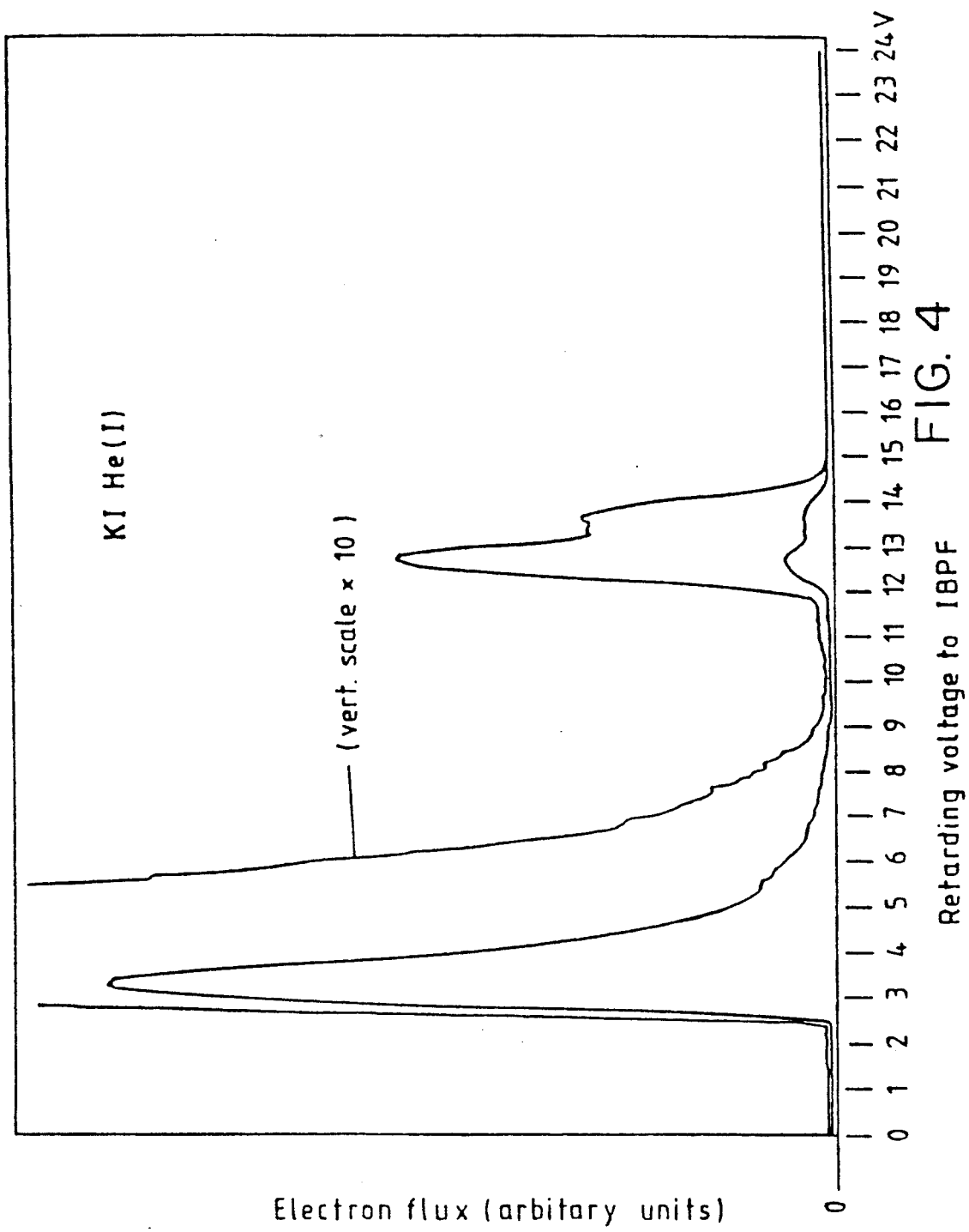

ELECTRON IMAGING BAND PASS ANALYSER FOR A PHOTOELECTRON SPECTROMICROSCOPE

CROSS REFERENCE TO RELATED APPLICATIONS

This application is a continuation of copending application Ser. No. 634,878, filed on Mar. 11, 1991, U.S. Pat. No. 5,166,519, entitled "A Charged Particle Energy Filter".

FIELD OF THE INVENTION

The present invention relates to an image band pass filter operating in a photoelectron spectromicroscope and particularly to the low pass filter elements of that image band pass filter.

BACKGROUND OF THE INVENTION

An image band pass filter operating in a photoelectron spectromicroscope is known and comprises two stages, the first comprising a region in which a beam of imaging electrons is deflected in the crossed electrostatic and magnetic field between a succession of electron mirrors which are designed to remove electrons of a certain energy and reflect those of a particular energy which are to form the electron image.

The beam from the first stage is then transferred to the second stage through a high pass filter into a region of the second stage and then deflected in an electrostatic and magnetic cross field along a path corresponding to a restoration of the displacement of the original beam in the first stage from its original path of travel.

In the first and second stage of the analyser as above described, the electrostatic field of the cross field is designed to be non-uniform whereby to control motion of the electrons in the cross field and correct for distortion of the image in the output beam.

In such spectroscopy the signal to background ratio is of high significance particularly in the detection of weak signals. The first low pass filter encountered by the image stream in the band pass analyser as described above, plays a vital role in determining the signal/scattered electron background ratio. This arises from the unwanted higher energy electrons obtaining axial momentum in the band pass range after elastic and inelastic collision with the absorber plate of the low pass filter and hence being transported through the analyser.

Such scattered electrons may have both large energy and low axial momentum thus contributing a diffuse background within the pass band of the subsequent low pass and high pass elements of the analyser.

SUMMARY OF THE INVENTION

It is an object of the present invention to overcome this defect and to reduce the proportion of elastically and inelastically scattered high energy electrons escaping the energy filters.

According to the invention there is provided a device for energy filtering a beam of imaging charged particles such as positions or electrons travelling under the control of a crossed electrostatic and magnetic field comprising a filter housing provided with an aperture for accepting the charged particles in the imaging beam, means for providing a virtual electrical potential surface within the housing for reflecting oncoming charged particles in the imaging beam having a potential energy below that of the virtual surface, and charged particle trap means for preventing oncoming higher energy charged particles passing through said virtual surface returning through said aperture via said virtual surface thereby to be lost to the system.

Advantageously the electron or other charged particle trap is provided by electrostatic field means acting transverse to the direction of travel of the oncoming higher energy electrons to transfer the electrons to magnetic flux lines of the prevailing magnetic field outside the aperture.

The electrons whose path of travel has been so diverted by the electrostatic field means, may then be absorbed by an electron absorption element arranged in their path of travel.

The electrostatic field means may incorporate sooted mesh structures held at varying potentials with respect to the wall defining the electron trap so creating non-axial electrostatic fields driving the electrons into complex motions and trajectories and eventually out of the system.

BRIEF DESCRIPTION OF THE DRAWINGS

An embodiment of the present invention will now be described by way of example with reference to the accompanying drawings wherein:

FIG. 4 shows a helium (I) photoelectron spectrum of (KI) showing the effect of the improved electron energy filter with electron trap of FIG. 2.

DESCRIPTION OF THE PREFERRED EMBODIMENTS

The invention will be illustrated in this disclosure mainly by reference to an electron imaging band pass analyser for use in a photo electron spectromicroscope which is designed to remove distortion of the electron image due to the use of inhomogeneous electrostatic fields of the deflecting crossed electrostatic or magnetic field employed, to achieve appropriate energy filtering.

It will be appreciated however that the invention is equally applicable in other areas of electron physics where the transport and analysis of beams in magnetic fields is involved.

Moreover although throughout reference is made to charged particles in the form of electrons, the device considered herein is equally suited to the manipulation of low energy positrons and will allow similtanious positron energy analysis and imaging. Positron imaging becomes possible by simply reversing the potentials of the filters in the analyser. The direction of trochoidal deflection is independent of charge.

Figure 1:
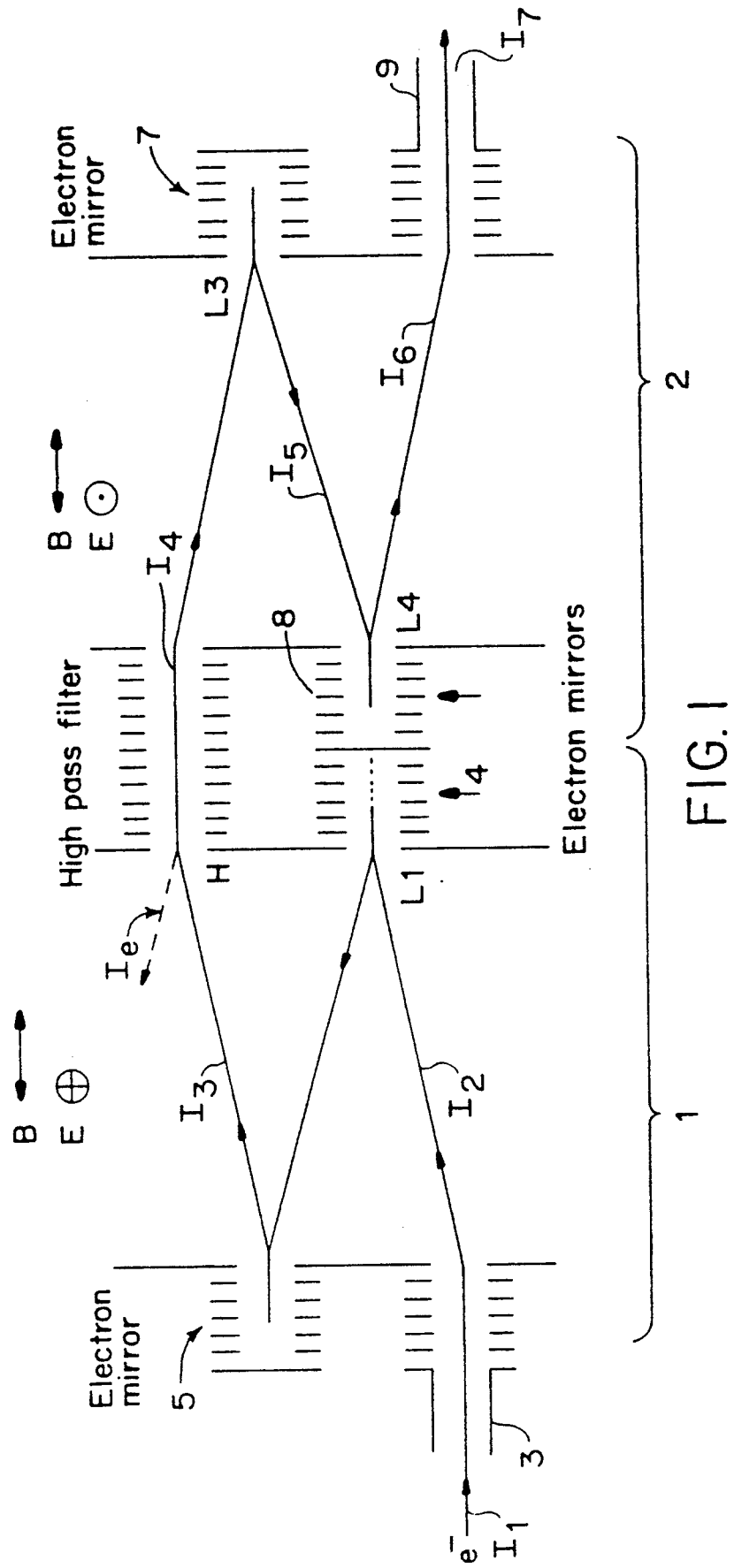
FIG. 1 is a schematic view of an imaging band pass electron energy analyser.

The electron imaging band pass analyser shown schematically in FIG. 1 is comprised of two analyser stages 1 and 2.

The first stage 1 incorporates a crossed electrostatic field E and magnetic field B as shown the direction of the magnetic field B being from left to right across the page of FIG. 1, whilst the electrostatic field direction E is into the page of FIG. 1 as indicated.

Additionally the first stage includes an entrance aperture 3 for an input beam $I_1$ of imaging electrons and consecutively axially offset with respect to the axis of the aperture 3 an electron mirror 4 in a low-pass energy filter L1 on the opposite side of the crossed E and B field region to aperture 3. Reflected beam $I_2$ is directed to an electron mirror 5 in a low-pass energy filter L2 on the same side of the crossed E and B field region and the entrance aperture 3. Beam $I_3$ a high pass energy filter is reflected from mirror S to H on the same side of the crossed E and B field region as the electron mirror 4.

The second stage 2 is equivalent to the first stage 1 comprising the high pass energy filter H. Imaging beam $I_4$ passes through filter H and contacts mirror 7 in low-pass energy filter L3. Beam $I_5$ is reflected from mirror 7 to mirror 8. From mirror 8 an imaging beam $I_6$ is directed to exit aperture 9. An output beam $I_7$ passes from aperture 9 and contains an energy filtered electron image produced in the system as will be described. The exception from this equivalency is that the E field direction is the reverse of that in the first stage and out of the page of FIG. 1 as indicated.

In operation the first stage 1 acts to deflect the beam $I_1$ to the electron mirror 4 which is associated with low band pass energy filter L1 for the imaging electrons in the beam $I_1$. In particular mirror 4 is a graded retardation potential.

High energy electrons in the beam $I_2$ which enter the retardation potential of mirror 4 are slowed, and if their initial energy exceed the potential of the end plate P (not shown) of the mirror 4, finally collide with it and are lost to the system. Electrons with an energy less than the potential applied to the end plate P are slowed by the field and finally reverse their direction.

The filtered low pass energy electrons of beam $I_2$ are then guided by the crossed E and B field to the electron mirror 5 and reflected as beam $I_2$ finally to the high pass energy filter H.

The high pass filter H rejects the lower energy electrons which then therefore re-enter the cross field E and B region of stage one and are further reflected as beam $I_e$ and are lost to the system.

The high energy electrons defining the beam $I_6$ emerging from the high pass filter H have an energy band pass width predetermined by the potential applied to the energy filters L2 and H and proceed into stage two of the analyser.

The purpose of the second stage is to cancel any residual energy dependent dispersion in the beam I, return the beam I to its original path of travel and introduce compensation for any shearing effects of the electron image in the beam.

The second stage 2 is consequently identical in construction to the first stage in the example shown, but, while providing identical field potentials, operates in an opposite field sense in that the electric force field E in stage 2 is oppositely directed to the electric force field E in stage 1.

The energy filtered electrons therefore in output beam I are guided to the exit aperture 9 via two further axially offset electron mirrors 7 and 8 associated with energy filters L3 and L4 respectively at opposite sides of the electric field E. The number of deflections and consequently reflections effected on the beam by the field E continues until an output beam $I_2$ through exit aperture 9 is produced travelling along a path corresponding to a restoration of displacement of the original beam in stage one of the original path of travel $I_1$.

The success of the shear correction provided by the analyser as described with reference to FIG. 1 is dependent upon the design of the non-uniform electrostatic fields in the cross field regions of the analyser.

As mentioned in the preamble to this disclosure, in the use of such a band pass analyser as above described in the photoelectron spectromicroscope, the effect of electron scatter due to insufficient absorption of unwanted electrons contributes to the presence of a diffuse background within the pass band of the subsequent low pass and high pass elements of the analyser.

This effect can be reduced by using a virtual surface rather than a real (absorbing) electrode in the first low pass mirror 4.

A saddle field; as used in the high pass element 6, is suitable for providing the virtual surface but the transmitted flux then constitutes the rejected part of the signal. This transmitted flux according to the invention is removed completely by passage through a transverse electrostatic field to a final trap or dump on a magnetic field line different from those passing though the apertures of the low pass filters, or if absorption is still not complete a succession of further similar traps is possible.

However in the limited space available in the image band pass filter shown in FIG. 1, suitable trapping of the unwanted electrons is achieved by incorporating high porosity mesh structures at a positive potential, angled or bent, which in conjunction with negatively charged adjacent side electrodes, introduces local large transfer electric fields which promote collision with those negative charged electrodes.

Scattered electrons are then unable to re-enter the saddle field region of the filter because they are transferred to magnetic flux lines which lie outside the aperture of the filter and eventually lost to the system.

This combination of a high pass filter with an efficient electron trap owes its effectiveness to the dominant effect of the axial magnetic field present in the image band pass filter as above described.

In an effort to determine the most efficient electron absorber the low energy (0-35 ev) electron scattering properties of a number of vacuum compatible surfaces and structures was carried out. An electron beam around 1 mm diameter, was directed normal to the test surface. The collected current to this surface and a diffusely reflected flux was separately recorded. Such surfaces investigated comprised acid etched copper, graphite, platinum black and xylene soot copper and sooted multiple grid structures. Electron absorption was found to increase along the series, the most efficient absorber being a set of three sooted grids spaced one from the other. Above 5 eV incident energy this yielded 13% electron scattering compared to acid etched copper foil at 70% electron scattering.

From the above results an electron trap structure was designed for use behind the saddle field in the first low pass electron filter of the image band pass filter shown in FIG. 1.

Figure 2A:
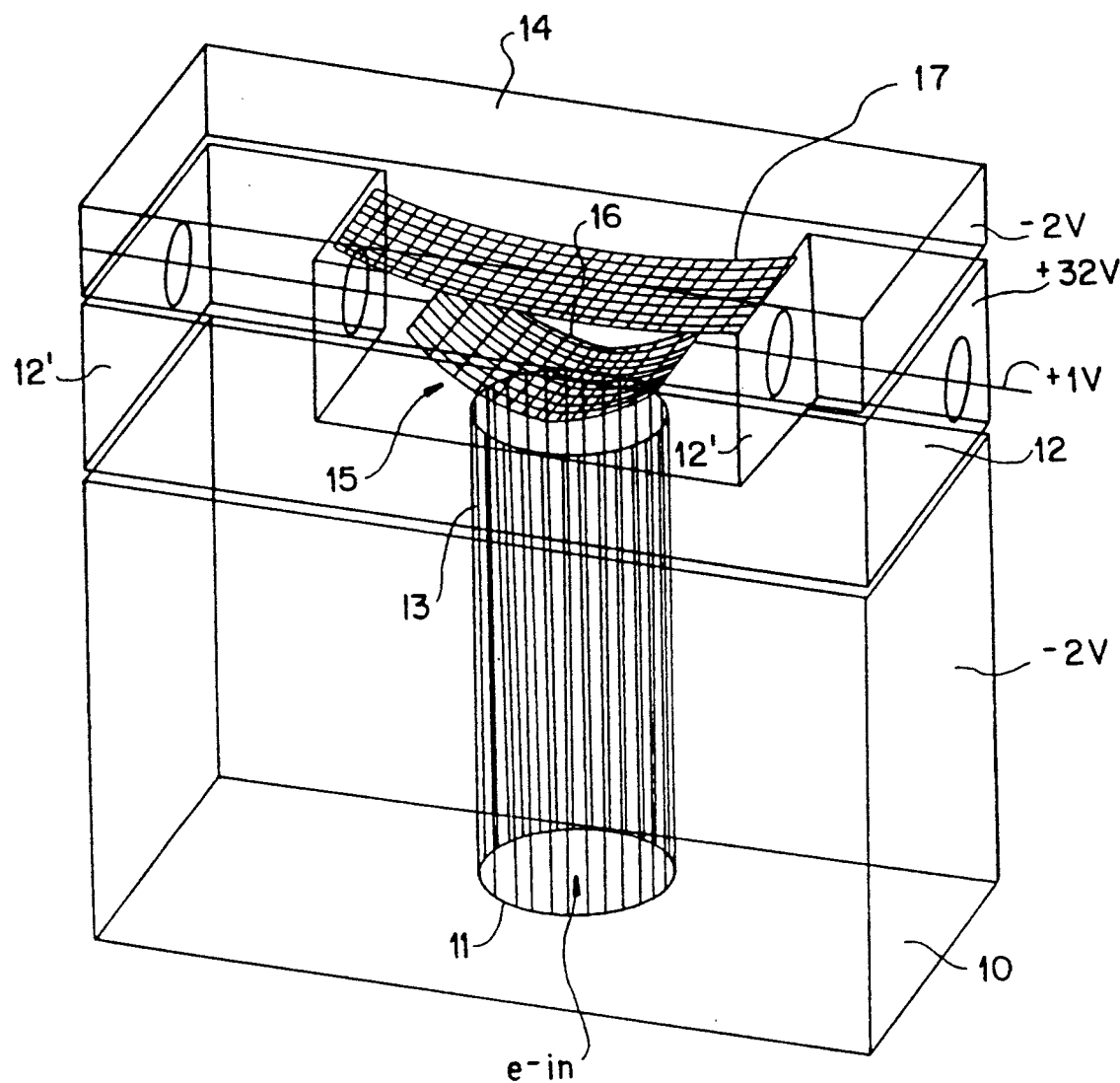
FIGS. 2(a), 2(b) and 2(c) are front and rear perspective views and a schematic view respectively of a low pass filter incorporating a virtual energy reflecting surface followed by an electron trap.
Figure 2B:
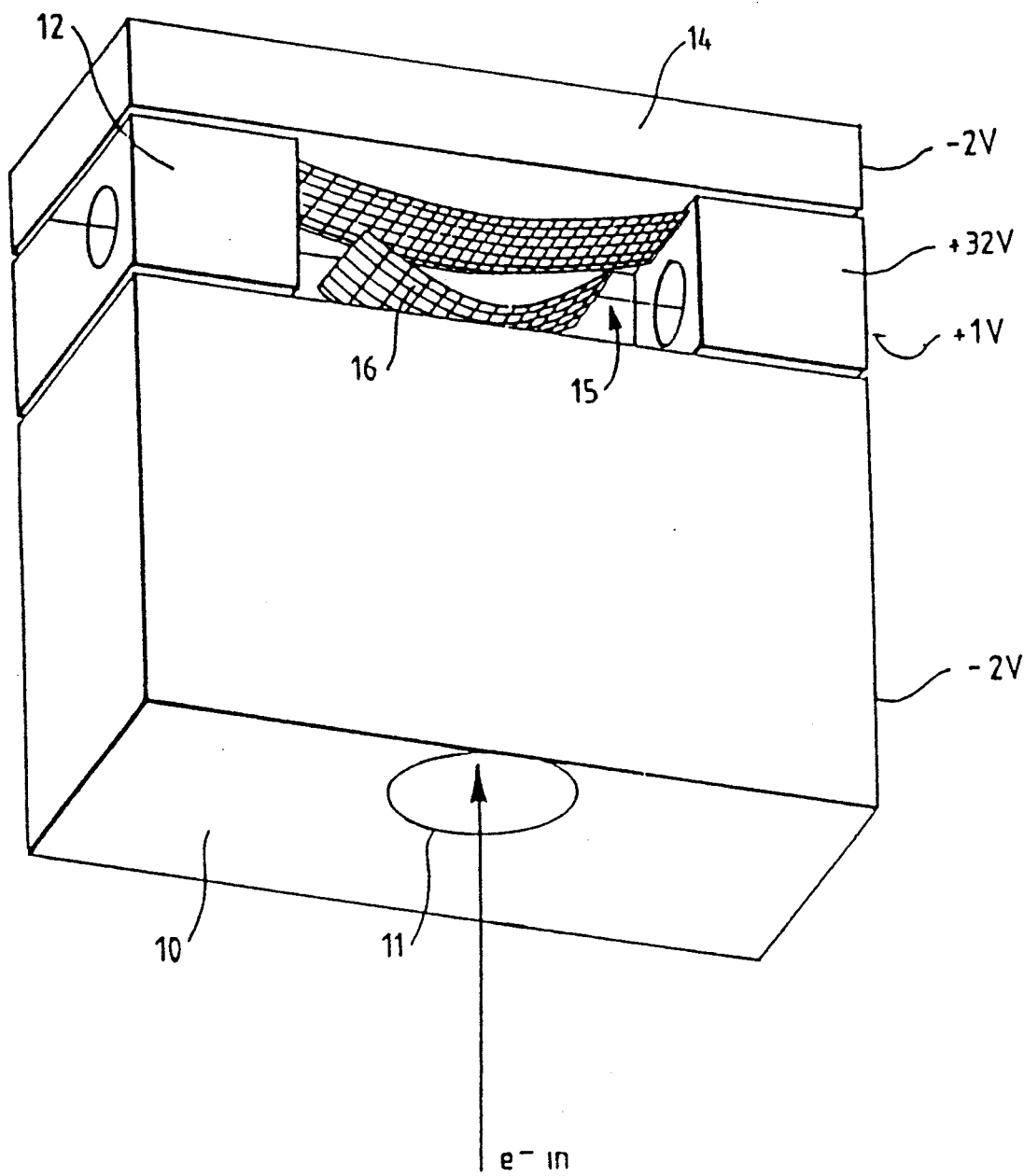
Figure 2C:
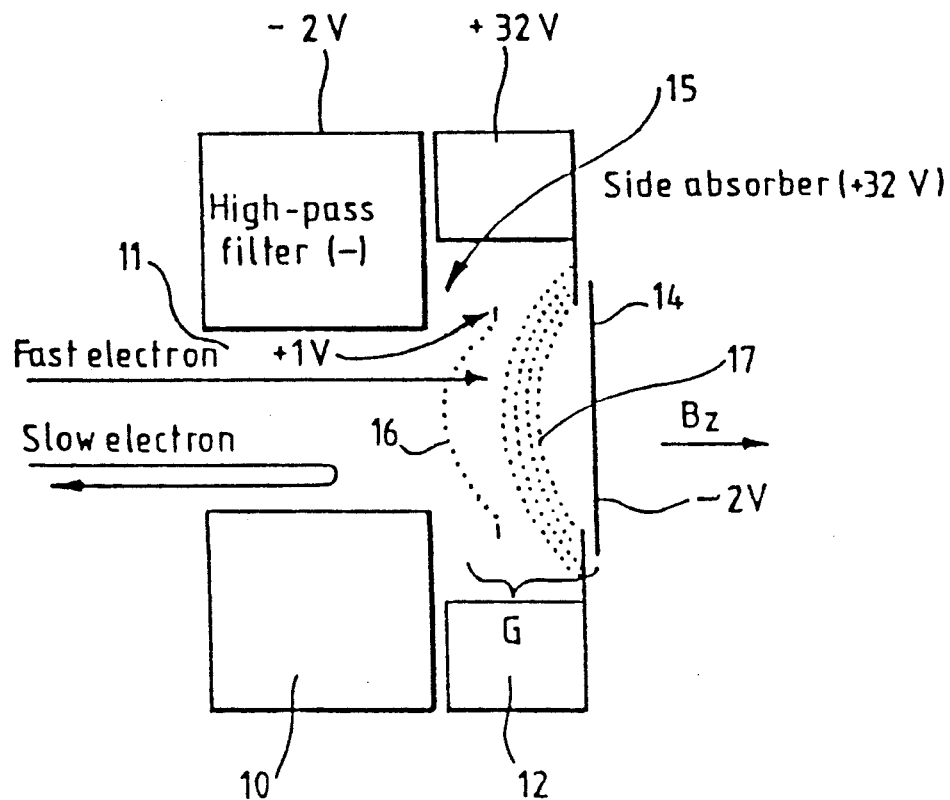

An energy filter incorporating an electron trap according to an embodiment of the invention is shown in FIGS. 2(a), 2(b) and 2(c).

The filter structure is made of a block 10 provided with a cylindrical passageway 11 for passing imaging particles in the form of electrons e as shown for interacting with a saddlefield created therein.

A V-shaped block 12 is mounted to one end of the block 10, the base of the block 12 having a cylindrical hole 13 corresponding to the cross-section of passageway 11 and coaxial with it in assembly.

A closure plate 14 is fitted to the top of the arms 12' of the block 12 to form an enclosure 15 of the electron trap.

A set of sooted grids G see FIG. 2c are mounted between the arms 12' within the enclosure 15. The sooted grids are bent towards the opening to the hole 13 and lie transverse to the axis of that opening and in the path of incoming electrons.

The first sooted grid 16 screens the saddle field formed in the cylindrical passageway 11 from the more positive potential of the walls of the electron trap formed by the U-shaped block 12.

Behind the grid 16 is a further collection of four sooted grids 17 only one being shown in FIGS. 2(a) and 2(b).

To complete a workable assembly a top electrode held at −1.9 V typically is provided which has been omitted from FIGS. 2(a), 2(b) and 2(c) for clarity.

Typical voltages which may be applied to the structure of FIGS. 2(a), 2(b) and 2(c) to render it effective are as shown in FIGS. 2(a), 2(b) and 2(c).

The block 10 is held at −2V. The first grid 16 is held at +1 volts which screens the saddlefield from the more positive potential of the trap walls.

The grids 17 are placed at the side wall potential of the trap, three walls of which are held at +32 volts with the other constituted by the plate 14 held at −2 volts, thereby creating strong non-axial electrostatic fields which cause the electrons to be deflected by the combined E and B fields in complex trajectories behind the mesh structures 16, 17. A final electron absorber surface constituted by the plate 14 lies behind the grids as shown.

The direction of the prevailing applied magnetic field present when the filter is used in the image band pass filter of FIG. 1 is denoted in FIG. 2(c) as $B_Z$ and is directed axially of the cylindrical passageway 11.

Figure 3:
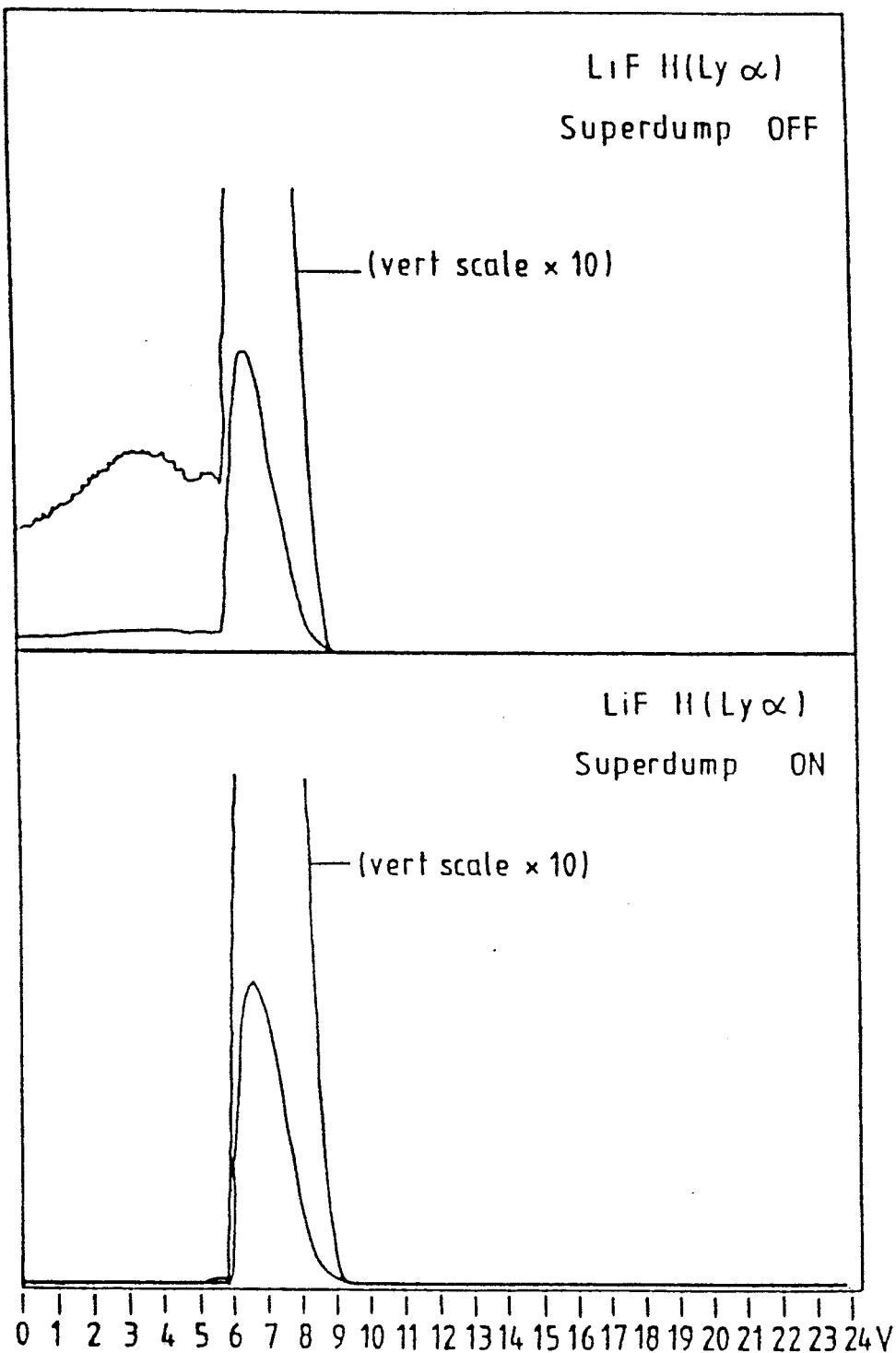
FIG. 3 shows Lyman-Alpha photoelectron spectra illustrating the usefulness of the structure shown in FIG. 2.

The effect of this improved electron trap on the removal of scattered electron flux is illustrated in FIGS. 3 and 4. FIG. 3 shows LiF Lyman Alpha photoelectron spectra which supplies a copious electron flux limited to a relatively narrow electron energy range, the upper spectrum in FIG. 3 being obtained with all the low pass electrodes at the common low pass potential, while in lower spectrum shown in FIG. 3, the electron trap was active with the optimum positive potentials on the absorbers. It will be seen that the signal to background ratio is improved by factor of 100.

A more practical example is provided in FIG. 4 showing the He(I) photoelectron spectrum of KI. This shows excellent signal to background over a wider energy range.

The above spectra were obtained by scanning the potential of the image band pass filter through the range 0 to −24 volts with a negitative bias (−9 volts LiF, −4 Volts KI) applied to the specimen. The specimen area of 30×30 $\mu m^2$ for LiF and 20×20 $\mu m^2$ KI was selected by computer mask on the recorded image.

ADJUSTMENT OF MAGNETIC FIELD AND FILTER VOLTAGES TO SELECT ANGULAR DISTRIBUTION

Electrons emitted in a divergent magnetic field undergo collimation; the orientation of their momenta changes to lie closer to the magnetic axis on going from a region of high field to low. This is the basis for the analysis of the angular emission of emitted electrons (Turner 1981), a technique we refer to as "skimming" (Plummer 1983, Kruit 1983). Skimming in the earlier sense used by us uses a potential barrier (e.g. an axially symmetrical transparent electrode placed across the electron stream) immediately adjacent to the specimen, before momenta redistribution through magnetic field change has occurred. It serves to reverse, along the z-axis, all electrons whose axial component of momentum is less than that required to overcome the barrier. Depending on the transverse momentum and hence total energy of the electron, this will define an energy dependent half cone angle of electrons which pass the potential barrier and form the final image. This can be used to advantage by removing electrons with large transverse momenta and hence improve image spatial resolution in the PESM.

We now describe how a corresponding angle selection can be performed after the main magnification and collimation has occurred. This permits the extraction of the azimuthally averaged (due to cyclotron motion) axial angular distribution. The angular distribution will provide a further contrast mechanism. This is likely to be a major effect in re-emitted positron spectroscopy since the positrons are emitted in a narrow cone (+/−20°) normal to the sample's surface. For a faceted sample the surface topography would generate this contrast effect dependent on the local face orientation.

The angular redistribution in collimation is never entirely complete as the ratio of B(2) to B(1) is always finite.

$$p_{para}^2(2) = |p_{total}|^2 - (p_{perp}^2(1) \cdot |B(2)|/|B(1)|) \qquad (1)$$

alternatively $$\sin \phi(2) = \sin \phi(1) \cdot \mathrm{sqrt}\,(|B(2)|/|B(1)|) \qquad (2)$$

where $\phi(1)$ and $\phi(2)$ are the half cone angles of the extent of the electron distribution in magnetic fields B(1) and B(2) (Beamson 1980, Kruit 1983).

This new technique relies on the fact that the magnetic field in the IBPF region due to the main (superconducting) magnet is still mildly divergent and, though this divergence is mostly removed to simplify the IBPF design, the magnetic field in the first half of the IBPF may be made slightly different from that in the second, mirror image, half.

Angular selection is possible in the IBPF region if:

1) The B field at low-pass filters L2 and L3 (See FIG. 1) is different from that at the center, where the low-pass filter L1 and high-pass filter H are situated. The consequence of this is that the axial momentum will be a function of the local field at each filter by equations 1 and 2.

2) The voltages applied to L2 filters and L3 are adjusted to absorb a different range of the electron flux, these voltages being related to the axial component of the momentum and hence also affected by the change in magnetic field B between low-pass filters L1 and L2 and between the high-pass filter H and low-pass filter L3. The useful variables are the voltages differences of the respective filters, for example L3-L1 and L2-H.

SELECTION OF SMALL AXIAL ANGLE ELECTRONS

At its simplest (skimming to leave only the small axial angle electrons) the method works as follows.

A momentum conversion caused by moving to a different magnetic field strength is not a function of the energy of the electron, since different energy electrons oriented at the same angle in one field strength all get mapped to the same new angle in another B field. When an axial retardation field is encountered electrons with differing energies launched at the same angle will be mapped to different angles (and energies) after retardation.

1) The accepted energy range is defined by setting the low-pass filter L1 and the high-pass filter H to define the pass band. Those selected electrons subsequently pass to filter L3. If this lies in a lower magnetic field than filters L1 and H, then further transverse to axial momentum interconversion will occur. This increases the overall axial momentum of the selected electrons.

2) Filter L3 can then be set to absorb some of the new higher energy electrons. This effectively removes electrons which were initially emitted with large axial angles at lower energies. The remainder of the electrons (those with the largest axial angles at filter L3) pass on to filter L4, are totally reflected, and are sent on to the detection system.

In practice the ratio of the fields between the centre and the ends of the IBPF should differ only slightly since the compensatory action of the second stage of the IBPF upon image distortion generated in the first half would be diminished.

SELECTION OF A RANGE OF ANGLES

Further refinement is possible to allow a defined angle range to be passed. This relies on an initial retardation followed by a momentum interconversion.

Figure 5A:
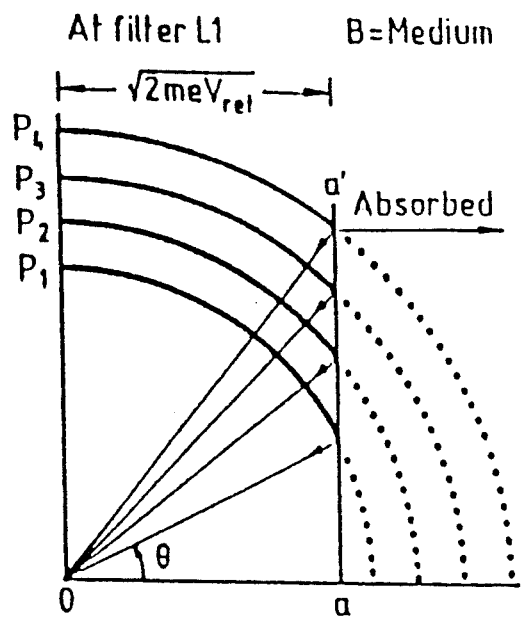
FIGS. 5a–5d are graphic representations of the effects of retardation in the momentum of electrons due to a change in the strength of a magnetic field exposed to the electrons.
Figure 5B:
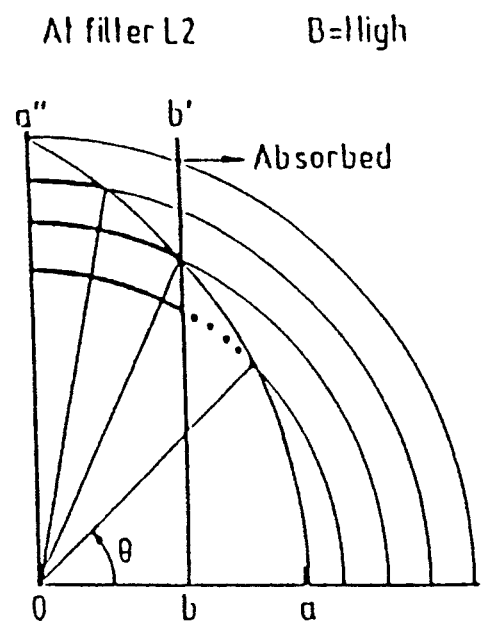
Figure 5C:
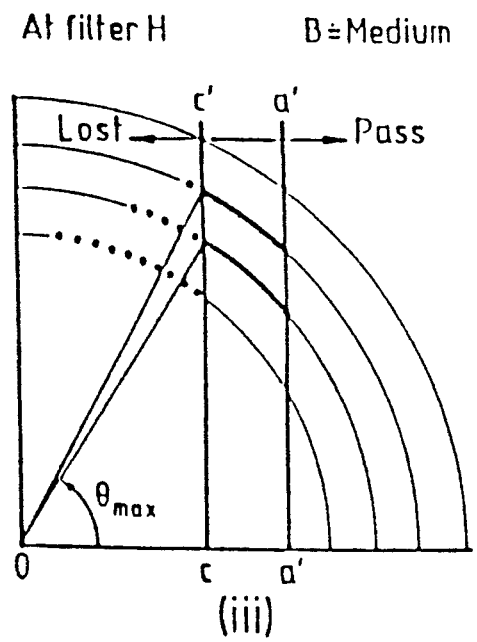
Figure 5D:
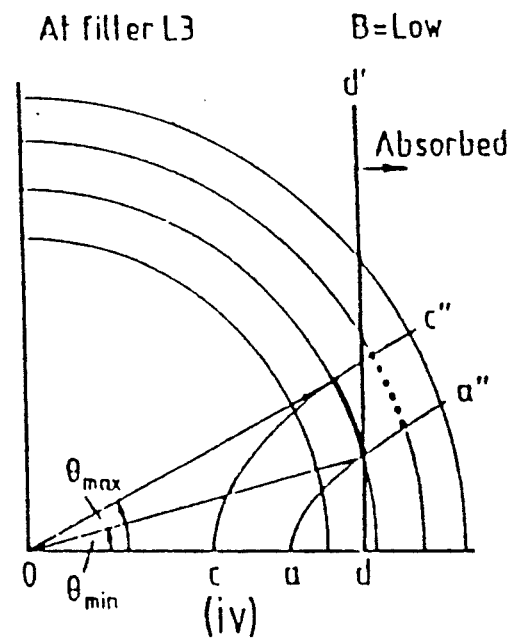

FIGS. 5(i) and 5(ii) show the effect of retardation followed by a change in magnetic field. The magnetic axis is horizontal and all distances are proportional to momentum. The outer arc indicates the loci of an isotropic angular distribution of high momentum electrons emitted from a point O. Lower energy electrons will have their momenta indicated by nested arcs within this one (e.g. $P_1$, $P_2$ and $P_3$).

If we apply an axial retardation to these families of electrons, using filter L1, all electrons whose axial momentum is less than $\sqrt{2meV_{ret}}$, will be reversed. The line a—a', FIG. 5(i), represents an axial momentum limit imposed by such a retardation field. Thus any high momentum electrons whose axial angle is greater than some $\theta$ will be reversed. Also the cut-off angle for lower momentum electrons is given by where the line a—a' cuts the arc corresponding to their total momentum. The equation relating the minimum angle to the retardation and electron energy is:

$$\cos \theta(min) = sqrt(V_e/V_r) \qquad (3)$$

where $V_e$ is the electron energy in electron volts and $V_r$ is the retardation potential in volts. On encountering filter L1 the direction of the electron's motion is reversed in the z-axis and the electron emerges with an angle of $(180° - \theta)$ degrees.

We now consider the fate of these selected electrons when they pass into regions with higher or lower magnetic fields. According to equation 2, the angle which an electron's momentum makes to the axis is increased on going to higher field strength and decreased on going to lower. Note however that the transformation is not linear, different starting angles are changed to varying extents.

On leaving filter L1 the electrons are transported to filter L2 experiencing an increase in magnetic field, which according to equation 2 results in an increase of the axial angle, FIG. 5(ii). Note that lower energy electrons will be mapped into different cone angles than higher ones since their starting angles were different.

Any electrons which had near 90° axial angle would be reflected in the magnetic mirror before reaching filter L2. In reality the magnetic collimation from the sample to filter L1 has already oriented the electrons to lie close to the axis and magnetic mirror reflection could only take place in the impractical situation of the magnetic field at filter L2 being greater than that at the sample. We however continue the analysis considering a complete initial population of axial angles.

The retardation field at filter L2 allows us again to absorb lower energy electrons with small axial angles as indicated by the dotted line to the right of b—b' in FIG. 5(ii). The higher energy electrons with large axial angles are reflected by the potential and pass to the high-pass filter H, travelling back into the weaker field. This again reduces their axial angles. FIG. 5(iii) shows the situation; the higher axial angle electrons, if appropriate, have been lost by the magnetic mirror effect and the small axial angle electrons of the lowest energy group were absorbed in filter L2.

In the high pass filter we can reject electrons with low axial momenta by applying an appropriate potential to the filter. Line c—c' in FIG. 5(iii) is the high pass cut-off. This allows us to reject the majority of the low energy electrons and reject the highest angle intermediate momentum electrons defining a highest allowed axial angle, $\theta(max)$. The highest momentum electrons are unaffected. The remaining intermediate and higher momentum electrons now pass to filter L3 lying in a lower magnetic field.

On going to a lower magnetic field the axial angles are decreased according to equation 2. The arc a—a'' in FIG. 5(iv) represents the new position of the limiting line a—a' after a field decrease. It can be seen that this change of field has separated out the different cones and determined new axial momenta. We are now in a position to eliminate by retardation high energy electrons whose momentum is mostly transverse to the axis. A retardation of axial components indicated by the line d—d' in filter L3 now determines the minimum axial angle we wish to accept of the intermediate electrons, $\phi(min)$ and allows the absorption of the higher energy electrons with small axial angles. What now remains are intermediate energy electrons lying between axial angles $\phi(max)$ and $\phi(min)$. These are transported to filter L4 which is made totally reflecting and the electrons pass to the imaging system.

Figure 6:
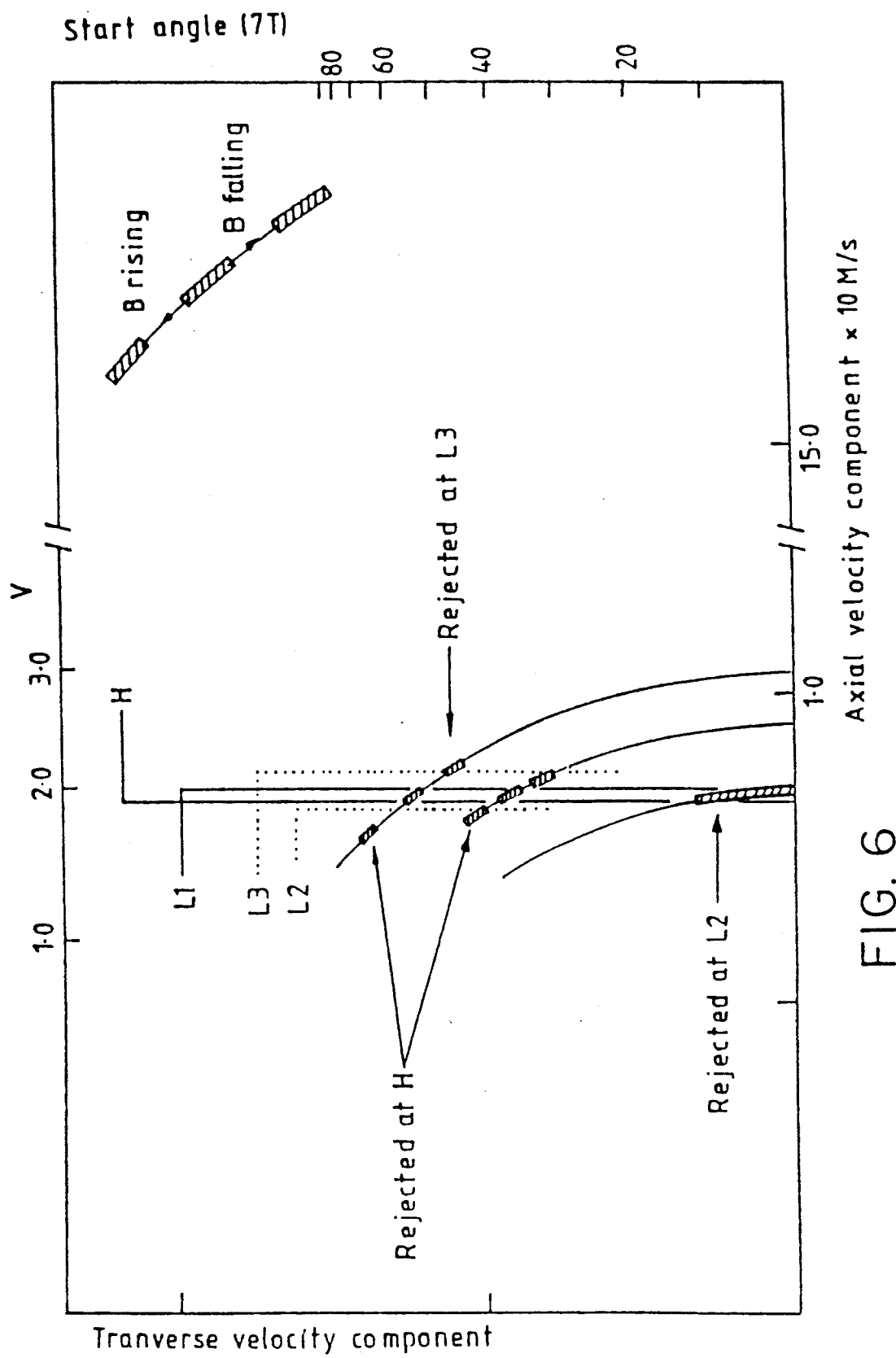
FIG. 6 is a graphic representation summarizing the momentum retardation effects graphically illustrated in FIG. 5.

By way of a quantitative example relevant to X-ray photoelectrons we show the case for 700 eV electrons initially emitted isotropically in a 7 T field. Three energies are considered 700.0, 700.5 and 701.0 eV. After collimation by a magnetic field divergence to 0.016 T and a retardation voltage step of −698.0 eV the momentum vectors are distributed into the three arcs shown in FIG. 6. Filters L1 and H are set to pass a 0.1 eV band at 2.0 eV. With a 20% change in B going to filters L2 and L3 the vectors are redistributed and a possible angle selection by the adjustment of filters L2 and L3 indicated. The effect of a retardation sequence as described in FIG. 5 is summarised in FIG. 6 with the voltage potentials of filters L1-3 and H shown. The effect of a rising magnetic field is shown in the insert—a rising magnetic field strength reduces the axial momentum component.

POSITRON RE-EMISSION SPECTROMICROSCOPY: SIMULTANEOUS IMAGING AND SPECTROSCOPY

There has been considerable interest in the possibilities for application of low energy (~1-2 eV) positrons for the study of sub-surface structures (see for example Fischer 1986 and Gidley 1988). This arises from the ability to make energy measurements on positrons re-emitted after trapping in solids (Zitzewitz 1980 and earlier references cited therein). This is sufficient to reveal the changes in internal potential which are due to chemical changes in sub-surface layers independently of surface changes. These measurements can thus be made on specimens which are surface contaminated and hence do not require special cleaning, surface preparation or UHV conditions. The lateral resolution however for such experiments has been limited by the difficulty of combining energy measurement with efficient transport of positrons to a detector while maintaining spatial integrity of an image beam. A proposal has been made to use a cylindrical electrostatic deflection field to cause energy selection during transport of a positron beam along a uniform magnetic field to an imaging detector (lutchins 1986). This however produces a chromatically dispersed image which only allows energy selection between images widely separated in energy and also produces a rotated image. We have solved this problem for electrons with the IBPF in its PESM context and now propose that it be applied to positron imaging.

ENERGY RESOLUTION POSSIBLE IN POSITRON EMISSION SPECTROMICROSCOPY

The elastic positron emission energy band is a few tens of millielectron volts. The IBPF has been tested to a bandwidth of <10 meV for He(I) photoelectrons from argon gas which is a more than 10-fold improvement compared with that typical in positron studies. We have regularly used the IBPF at 100 meV bandwidth for surface studies, an arbitrary choice and this can easily be reduced when appropriate.

LATERAL RESOLUTION

Present positron measurements features an area defined by the implanting beam size, typically 1 mm in dia. In the PESM the lateral resolution is determined by cyclotron orbit motion in the emergent beam and although this is affected by consideration of the features to be resolved (points best, edges worst) the dominant effect relates to electron, or here, positron velocity and for the 1-2 eV range appropriate to trapped positron studies in a 7T field is less than 1 micron, reduced still further since positron emission occurs within a small angle to the local surface normal. For emission from a surface normal to this field into a cone semiangle of 2 degrees a spatial resolution of <30 nm is expected for 2 eV positrons.

SOURCE INTENSITY REQUIRED

The PESM approach uses magnetic field guidance to effect 100% collection efficiency as is usual in positron experiments. In addition however the PESM uses a divergent field to effect momentum conversion which preserves this high efficiency through the subsequent analyser in contrast to the conventional positron energy methods which employ restricted acceptance angle (low efficiency) analyser (+/−6° has been quoted (Gidley 1988). Since the PESM accepts +/−90° the sensitivity gain could thus be as much as 200×.

SEQUENTIAL IMAGING BY PHOTOELECTRONS

The same object can be imaged by both positrons and electrons. By changing the polarity of all of the fields the electron image generated by one of the standard sources, especially He(I) and fast atom beams which give very strong images, can be used to assist in identification of the topography and orientation of the region of interest in a complex object. This also introduces the possibility of obtaining independent and complementary structural, atomic and chemical information of the surface.

I claim:

1. An image band pass filter for a photoelectron spectromicroscope comprising,
    a band pass region having a first stage for receiving an input beam of imaging charged particles and a second stage for emitting an output beam of imaging charged particles,
    an electrostatic field and a magnetic field positioned in a crossed relation in said first and said second stages, said crossed fields being directed at the imaging beam,
    a plurality of charged particle energy filter means positioned in said band pass region for successively energy filtering the imaging beam, said filter means deflecting the imaging beam in a preselected direction along a path of travel under the influence of said crossed field,
    said electrostatic field in said second stage being oppositely directed with respect to said electrostatic field in said first stage so that the path of travel of the imaging beam in said second stage is reverse to the path of travel of the imaging beam in said first stage, and
    means for providing different magnetic field strengths at selected ones of said charged particle energy filter means to generate in said second stage a resultant output beam having a momentum within a selected angular range with respect to an axis of said magnetic field.

2. An image band pass filter as set forth in claim 1 which includes,
    a high pass filter positioned between said first stage and said second stage,
    said high pass filter being followed by a low pass filter in said second stage,
    said low pass filter positioned in a lower magnetic field than said high pass filter to decrease the axial angle of momentum of the charged particles in the imaging beam, and
    said low pass filter being set to reflect in the imaging beam the charged particles having axial angles of momentum greater than a preselected magnitude and within a preselected energy range to form the resultant output beam.

3. An image band pass filter as set forth in claim 1 wherein,
said first stage includes first and second successively positioned low pass filters,
said second stage including third and fourth successively positioned low pass filters, and p1 a high pass filter being positioned intermediate said first and second stages and between said second and third low pass filters.

4. An image band pass filter as set forth in claim 3 wherein,
said second low pass filter in the said first stage is positioned in a higher magnetic field than said first low pass filter in said first stage to increase the axial angles of momentum of the charged particles.

5. An image band pass filter as set forth in claim 3 wherein,
said second low pass filter in said first stage is set to reflect charged particles having an axial angle of momentum greater than a predetermined magnitude and in a preselected energy range.

6. An image band pass filter as set forth in claim 3 wherein,
said high pass filter is positioned in a lower magnetic field than said second low pass filter to decrease the axial component of the charged particle.

7. An image band pass filter as set forth in claim 3 wherein,
said high pass filter is set to accept charged particles from said second low pass filter within a preselected energy range and having an axial angle of momentum less than a magnitude defining the highest allowable axial angle of momentum of the charged particles in said output beam.

8. An image band pass filter as set forth in claim 3 wherein,
said third low pass filter in said second stage is positioned in a lower magnetic field than said high pass filter to decrease the axial angle of momentum of the charged particles.

9. An image band pass filter as set forth in claim 3 wherein,
said third low pass filter is set to reflect charged particles from said high pass filter within a preselected energy range and having an axial component of momentum greater than a magnitude defining the lowest allowable axial angle of the charged particles in said output beam to provide a beam of charged particles for reflection from said fourth low pass filter to emerge from said second stage as said resultant output beam.

* * * * *